(12) United States Patent
Wei et al.

(10) Patent No.: US 9,142,797 B2
(45) Date of Patent: Sep. 22, 2015

(54) GAS BARRIER SUBSTRATE AND ORGANIC ELECTRO-LUMINESCENT DEVICE

(71) Applicant: Industrial Technology Research Institute, Hsinchu (TW)

(72) Inventors: Hsiao-Fen Wei, New Taipei (TW); Liang-You Jiang, New Taipei (TW); Pao-Ming Tsai, Kaohsiung (TW); Yu-Yang Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/481,924

(22) Filed: Sep. 10, 2014

(65) Prior Publication Data

US 2014/0374736 A1    Dec. 25, 2014

Related U.S. Application Data

(60) Continuation-in-part of application No. 13/895,379, filed on May 16, 2013, now Pat. No. 8,864,540, which is a division of application No. 12/884,212, filed on Sep. 17, 2010, now abandoned.

(30) Foreign Application Priority Data

May 31, 2010   (TW) ................ 99117433 A

(51) Int. Cl.
   *H01L 51/52*   (2006.01)
   *H05B 33/04*   (2006.01)
   (Continued)

(52) U.S. Cl.
   CPC ............... *H01L 51/524* (2013.01); *B32B 7/02* (2013.01); *B32B 9/005* (2013.01); *B32B 15/085* (2013.01); *B32B 15/09* (2013.01); *B32B 17/00* (2013.01); *B32B 37/025* (2013.01); *B32B 38/10* (2013.01);
   (Continued)

(58) Field of Classification Search
   CPC ......... H01L 51/524–51/5256; B32B 2457/206
   USPC ................................................... 313/512
   See application file for complete search history.

(56) References Cited

U.S. PATENT DOCUMENTS

| 5,610,742 A | 3/1997 | Hinata et al. |
| 6,413,645 B1 | 7/2002 | Graff et al. |

(Continued)

FOREIGN PATENT DOCUMENTS

| TW | 200712607 | 4/2007 |
| TW | 200806073 | 1/2008 |

(Continued)

OTHER PUBLICATIONS

"Office Action of Taiwan Counterpart Application", issued on Feb. 17, 2014, p.1-p. 11, Jun. 24, 2015.

*Primary Examiner* — Sikha Roy

(74) *Attorney, Agent, or Firm* — Jianq Chyun IP Office

(57) ABSTRACT

A gas barrier substrate including a first gas barrier layer, a substrate, and a second gas barrier layer is provided. The first gas barrier layer has a central bonding surface bonded with the substrate and a peripheral boding surface surrounding the central bonding surface. The second gas barrier layer entirely covers the substrate and the first gas barrier layer. The second gas barrier layer is bonded with the substrate and the peripheral boding surface of the first gas barrier layer, wherein a minimum distance from an edge of the substrate to an edge of the first gas barrier layer is greater than a thickness of the first gas barrier layer.

18 Claims, 18 Drawing Sheets

(51) Int. Cl.

| | | |
|---|---|---|
| *B32B 7/02* | (2006.01) | |
| *B32B 17/00* | (2006.01) | |
| *B32B 9/00* | (2006.01) | |
| *B32B 15/085* | (2006.01) | |
| *B32B 15/09* | (2006.01) | |
| *B32B 37/00* | (2006.01) | |
| *B32B 38/10* | (2006.01) | |
| *B32B 38/00* | (2006.01) | |
| *B32B 37/24* | (2006.01) | |

(52) U.S. Cl.
CPC ........ *H01L 51/5253* (2013.01); *H01L 51/5256* (2013.01); *B32B 38/0004* (2013.01); *B32B 2037/243* (2013.01); *B32B 2307/7242* (2013.01); *B32B 2457/20* (2013.01); *B32B 2457/206* (2013.01); *B32B 2457/208* (2013.01); *H01L 2251/5338* (2013.01); *Y10T 428/24488* (2015.01); *Y10T 428/24521* (2015.01)

(56) References Cited

U.S. PATENT DOCUMENTS

| | | | |
|---|---|---|---|
| 6,866,901 | B2 | 3/2005 | Burrows et al. |
| 7,075,103 | B2 | 7/2006 | Yan et al. |
| 7,279,401 | B2 | 10/2007 | Wong et al. |
| 7,355,341 | B2 | 4/2008 | Yoshizawa |
| 7,378,157 | B2 | 5/2008 | Sakakura et al. |
| 7,444,733 | B2 | 11/2008 | Ho et al. |
| 2003/0197197 | A1 | 10/2003 | Brown et al. |
| 2003/0203210 | A1 | 10/2003 | Graff et al. |
| 2004/0229051 | A1 | 11/2004 | Schaepkens et al. |
| 2007/0049155 | A1 | 3/2007 | Moro et al. |
| 2007/0059854 | A1 | 3/2007 | Huang et al. |
| 2007/0141313 | A1 | 6/2007 | Burki et al. |
| 2007/0155252 | A1 | 7/2007 | Ferderer |
| 2007/0196682 | A1 | 8/2007 | Visser et al. |
| 2008/0238301 | A1* | 10/2008 | Shim et al. .................... 313/504 |
| 2008/0292786 | A1 | 11/2008 | Hatano et al. |
| 2009/0072230 | A1 | 3/2009 | Ito et al. |
| 2009/0261062 | A1* | 10/2009 | Kim ................................ 216/24 |
| 2010/0068483 | A1 | 3/2010 | Leu et al. |
| 2010/0090218 | A1 | 4/2010 | Tsukahara |

FOREIGN PATENT DOCUMENTS

| | | |
|---|---|---|
| TW | 200829070 | 7/2008 |
| TW | 201005696 | 2/2010 |

\* cited by examiner

GAS BARRIER SUBSTRATE AND ORGANIC ELECTRO-LUMINESCENT DEVICE

CROSS-REFERENCE TO RELATED APPLICATION

This is a continuation-in-part application of and claims the priority benefit of U.S. patent application Ser. No. 13/895,379, filed on May 16, 2013, now allowed. U.S. patent application Ser. No. 13/895,379 is a divisional of and claims the priority benefit of U.S. application Ser. No. 12/884,212, filed on Sep. 17, 2010, now abandoned, which claims the priority benefit of Taiwan application serial no. 99117433, filed on May 31, 2010. The entirety of each of the above-mentioned patent applications is hereby incorporated by reference herein and made a part of specification.

BACKGROUND

1. Technical Field

The disclosure is related to a gas barrier substrate and a package of an organic electro-luminescent device.

2. Related Art

Compared with general rigid substrates, flexible substrates have applications in a wider range of areas. Flexible substrates have advantages such as flexibility, portability, compliance with safety standards, and wide range of applications, but they also have disadvantages such as inferior heat resistance, inferior water and oxygen resistance, inferior chemical resistance, and greater thermal expansion coefficients. Since conventional flexible substrates cannot completely block water vapor or oxygen, aging of electronic devices on the substrate is accelerated, thereby shorting the lifespan of the electronic devices. Commercial requirements are hence unable to be fulfilled. In order to make flexible substrates have better water vapor and oxygen resistance, conventional art has provided a flexible substrate with a gas barrier layer for enhancing reliability of the electronic devices. FIGS. 1 and 2 are illustrated and conventional flexible gas barrier substrate is described as follow.

FIG. 1 is a schematic cross-sectional diagram of a conventional flexible gas barrier substrate. Please refer to FIG. 1. A conventional flexible gas barrier substrate 100 is generally fabricated on a carrier C and includes a substrate 110 and a gas barrier layer 120. The gas barrier layer 120 only covers a top surface 110a and a sidewall 110b of the substrate 110, and a bottom surface 110c contacts the carrier C. As shown in FIG. 1, when the flexible gas barrier substrate 100 is detached from the carrier C, the bottom surface 110c of the substrate 110 is exposed. Since the bottom surface 110c of the substrate 110 is not covered by the gas barrier layer 120, the flexible gas barrier substrate 100 warps seriously due to imbalance of stress.

In order to resolve the warp problems of the flexible gas barrier substrate, the conventional art has provided a solution, which is illustrated in detail in FIG. 2.

FIG. 2 is a schematic cross-sectional diagram of another conventional flexible gas barrier substrate. Please refer to FIG. 2. A conventional flexible gas barrier substrate 200 is also fabricated on the carrier C and includes a substrate 210, a first gas barrier layer 220, and a second gas barrier layer 230. The first gas barrier layer 220 only covers a bottom surface 210c of the substrate 210, and the second gas barrier layer 230 covers a top surface 210a and a sidewall 210b of the substrate 210 and a sidewall 220a of the first gas barrier layer 220. As shown in FIG. 2, the second gas barrier layer 230 is bonded with the sidewall 220a of the first gas barrier layer 220.

However, as limited by the thickness of the first gas barrier layer 220, the bonding strength between the second gas barrier layer 230 and the sidewall 220a of the first gas barrier layer 220 is insufficient. Therefore, when the flexible gas barrier substrate 200 is bended, the second gas barrier layer 230 which covers the sidewall 210b may be easily broken. Moreover, if the thickness of the first gas barrier layer 220 is increased for increasing the bonding strength between the second gas barrier layer 230 and the sidewall 220a of the first gas barrier layer 220, the overall thickness of the flexible gas barrier substrate 200 may increase.

In light of the above, one of the issues focused on by developers is how to effectively improve the gas barrier characteristic of the flexible gas barrier substrate without increasing the overall thickness of the flexible gas barrier substrate.

SUMMARY

A gas barrier substrate with good gas barrier abilities is provided herein.

A package of an organic electro-luminescent device which has good reliability is also provided herein.

The disclosure provides a gas barrier substrate including a de-bonding layer, a lift-off layer, a first gas barrier layer, a substrate, and a second gas barrier layer. The gas barrier substrate disposed on a carrier. The de-bonding layer is disposed on the carrier, and a portion area of the carrier is exposed by the de-bonding layer. The lift-off layer covers the de-bonding layer and the portion area of the carrier exposed by the de-bonding layer. The first gas barrier layer covers the lift-off layer. The first gas barrier layer has a central bonding surface and a peripheral bonding surface which surrounds the central bonding surface. An area of the central bonding surface is smaller than an area of the de-bonding layer. The substrate is bonded with the central bonding surface of the first gas barrier layer, wherein the substrate has a tapered sidewall, and an acute angle is included between the tapered sidewall and the central bonding surface. The second gas barrier layer covers the substrate and the first gas barrier layer. The second gas barrier layer is bonded with the substrate and the peripheral bonding surface of the first gas barrier layer. A minimum distance from an edge of the substrate to an edge of the first gas barrier layer is greater than a thickness of the first gas barrier layer.

The disclosure provides a gas barrier substrate, comprising a first gas barrier layer having a central bonding surface and a peripheral bonding surface which surrounds the central bonding surface; a substrate bonded with the central bonding surface of the first gas barrier layer, wherein the substrate has a tapered sidewall, and an acute angle is included between the tapered sidewall and the central bonding surface; and a second gas barrier layer covering the substrate and the first gas barrier layer, the second gas barrier layer being a conformal thin film, wherein the second gas barrier layer is bonded with the substrate and the peripheral bonding surface of the first gas barrier layer, and a minimum distance from an edge of the substrate to an edge of the first gas barrier layer is greater than a thickness of the first gas barrier layer; and a lift-off layer disposed on the first gas barrier layer, wherein the lift-off layer and the substrate are respectively located at two sides of the first gas barrier layer, the edge of the lift-off layer is substantially aligned with the edges of the first gas barrier layer and the second gas barrier layer.

The disclosure further provides a package of an organic electro-luminescent device, comprising: the above-mentioned first gas barrier substrate; a second gas barrier substrate bonded with the first gas barrier substrate; and an organic electro-luminescent device disposed between the first gas barrier substrate and the second gas barrier substrate.

Several exemplary embodiments accompanied with figures are described in detail below to further describe the disclosure in detail.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 3D' to 3E' are schematic cross-sectional diagrams showing another process of fabricating a gas barrier substrate.

FIGS. 4D' to 4E' are schematic cross-sectional diagrams showing another process of fabricating a gas barrier substrate.

DESCRIPTION OF EMBODIMENTS

First Embodiment

FIGS. 3A to 3E are schematic cross-sectional diagrams showing a process of fabricating a gas barrier substrate according to the first embodiment of the disclosure. Please refer to FIG. 3A. First, a de-bonding layer DBL is formed on a carrier C, and a lift-off layer L is formed on the de-bonding layer DBL and the carrier C. According to the present embodiment, the material of the de-bonding layer DBL is, for example, a parylene material, and the material of the lift-off layer L is, for example, polyimide or another material which is capable of being lift off from the de-bonding layer DBL. In an embodiment, the lift-off layer L may comprise a single thin film or a plurality of stacked thin films capable of being lifted-off from the de-bonding layer DBL. In another embodiment, the lift-off layer L may be a substrate capable of being lifted-off from the de-bonding layer DBL. For instance, the thickness of the lift-off layer L ranges from 5 micrometers to 30 micrometers. According to other embodiments of the disclosure, the de-bonding layer DBL may be formed by performing a surface treatment on a surface of the carrier C. According to the present embodiment, the lift-off layer L may also be peeled off from the carrier C along with the de-bonding layer DBL.

Figure 3A:
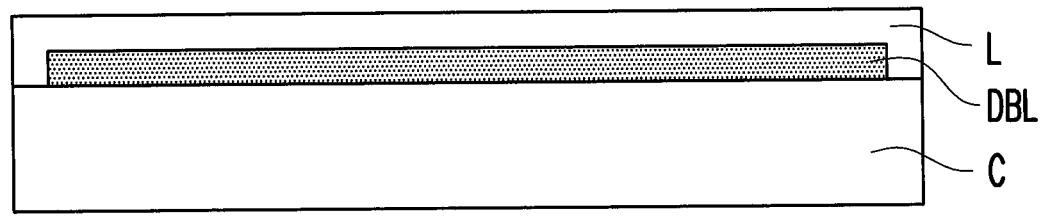
FIGS. 3A to 3E are schematic cross-sectional diagrams showing a process of fabricating a gas barrier substrate according to the first embodiment of the disclosure.
Figure 3B:
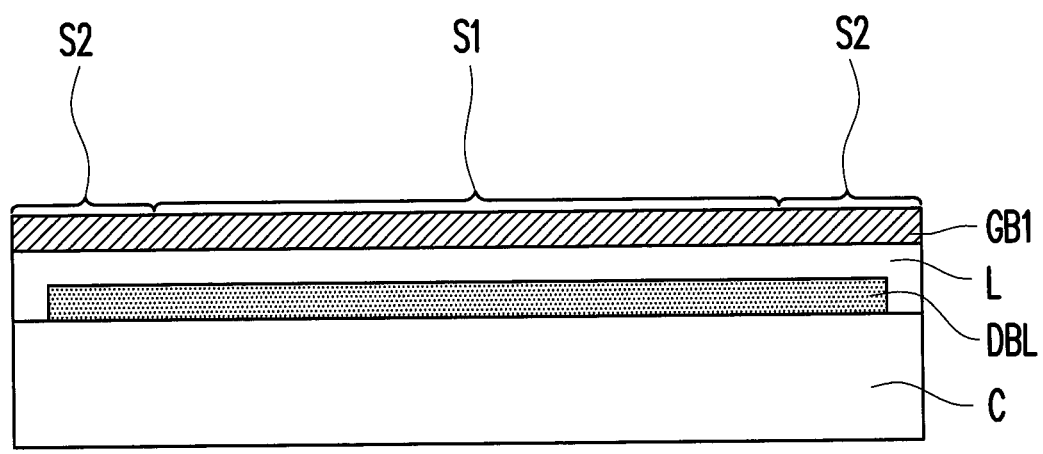

Please refer to FIG. 3B. A first gas barrier layer GB1 is formed on the lift-off layer L. The first gas barrier layer GB1 has a central bonding surface S1 and a peripheral bonding surface S2 surrounding the central bonding surface S1. According to the present embodiment, the first gas barrier layer GB1 is, for example, a single thin film (such as a single silicon nitride layer) or a stacked layer formed by a plurality of thin films. For example, the first gas barrier layer GB1 is, for example, formed by alternately stacking at least one silicon nitride layer and at least one spin-on glass (SOG) layer. According to other embodiments, the first gas barrier layer GB1 is formed by one or more pairs of a silicon nitride layer and an SOG layer. However, it should be noted that according to the disclosure, the number and material of the first gas barrier layer GB1 are not limited to the above configuration.

Figure 3C:
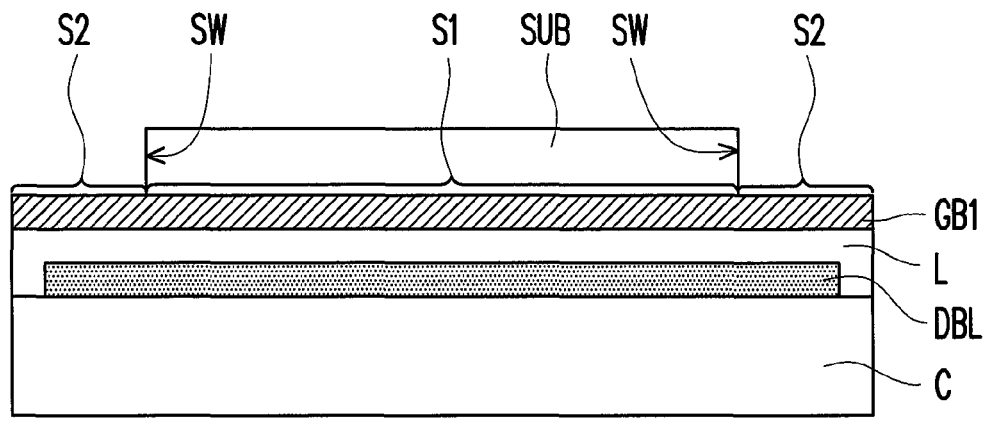

Please refer to FIG. 3C, a pre-formed substrate SUB is provided, and the pre-formed substrate SUB is bonded with the central bonding surface S1. According to the present embodiment, the substrate SUB has a sidewall SW which is substantially perpendicular to the central bonding surface S1 of the first gas barrier layer GB1. In addition, the material of the substrate SUB is, for example, polyimide or another flexible material.

Figure 3D:
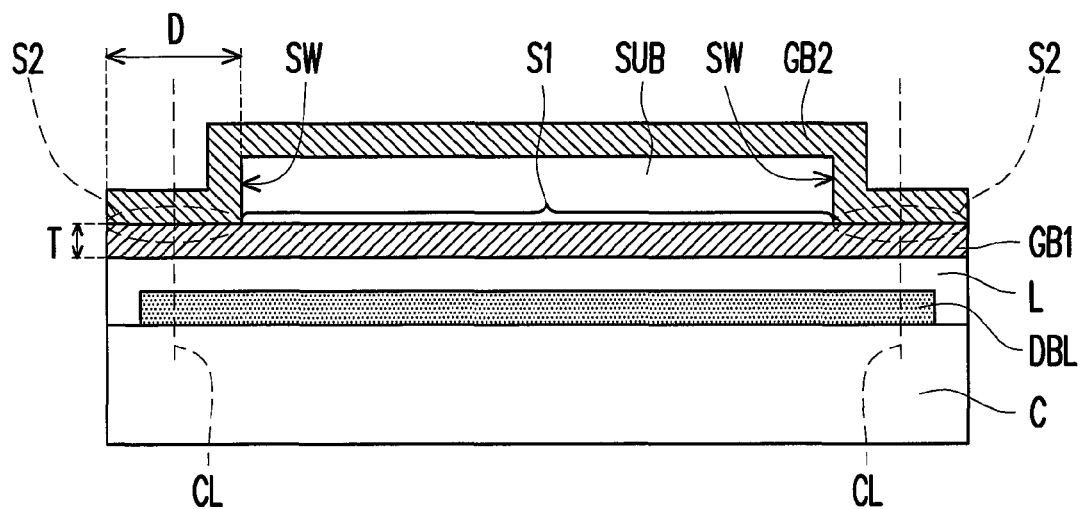

Next, please refer to FIG. 3D. A second gas barrier layer GB2 is formed to entirely cover the substrate SUB and the first gas barrier layer GB1, wherein the second gas barrier layer GB2 is bonded with the substrate SUB and a peripheral bonding surface S2 of the first gas barrier layer GB1. A minimum distance D from an edge (i.e. the sidewall SW) of the substrate SUB to an edge of the first gas barrier layer GB1 is greater than a thickness T of the first gas barrier layer GB1. In addition, the second gas barrier layer GB2 which covers the first gas barrier layer GB1 and the substrate SUB is, for example, a conformal thin film.

According to the present embodiment, the second gas barrier layer GB2 is, for example, a single thin film (such as a single silicon nitride layer) or a stacked layer formed by multiple thin films. For example, the second gas barrier layer GB2 is, for example, formed by alternately stacking at least one silicon nitride layer and at least one SOG layer. According to other embodiments, the second gas barrier layer GB2 is formed by one or more pairs of a silicon nitride layer and an SOG layer. However, it should be noted that according to the disclosure, the number and material of the second gas barrier layer GB2 are not limited to the above configuration.

Figure 1:
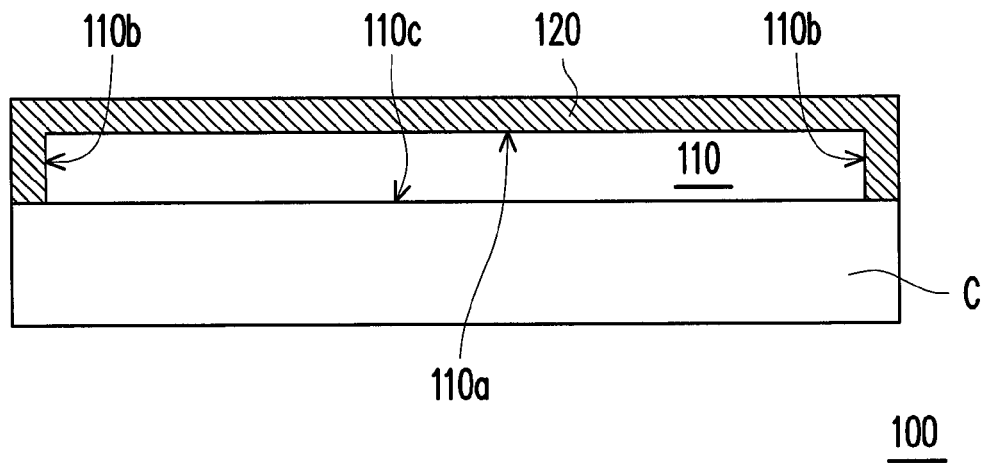
FIG. 1 is a schematic cross-sectional diagram of a conventional flexible gas barrier substrate.
Figure 2:
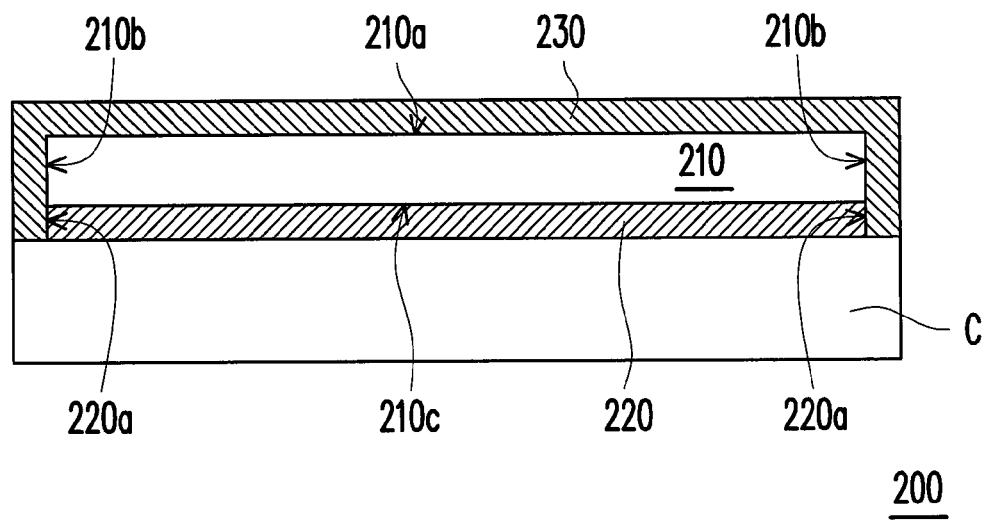
FIG. 2 is a schematic cross-sectional diagram of another conventional flexible gas barrier substrate.

As shown in FIG. 3D, since the minimum distance D is greater than the thickness T of the first gas barrier layer GB1, the bonding strength between the first gas barrier layer GB1 and the second gas barrier layer GB2 is effectively improved. If the first gas barrier layer GB1 and the second gas barrier layer GB2 have similar materials or the same material, the bonding between the first gas barrier layer GB1 and the second gas barrier layer GB2 is a type of homogeneous bonding, which thus provides good bonding strength. In addition, since the minimum distance D is greater than the thickness T of the first gas barrier layer GB1, compared with the conventional art (FIG. 2), if water vapor is to permeate into the gas barrier substrate according to the present embodiment, a longer permeation path is required.

Figure 3E:
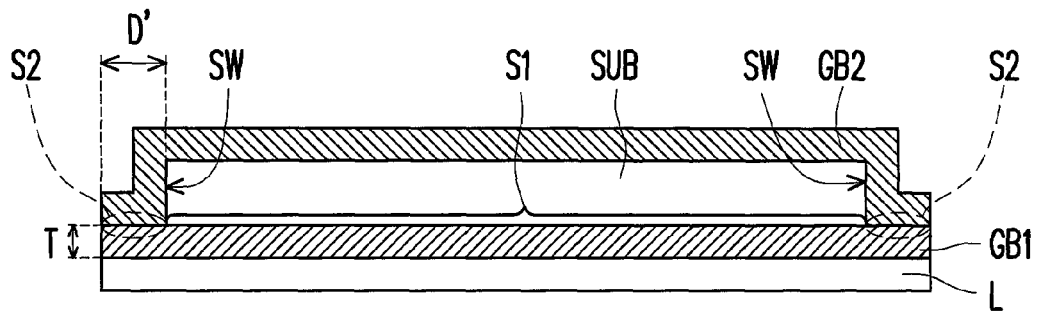
Figure 3D:
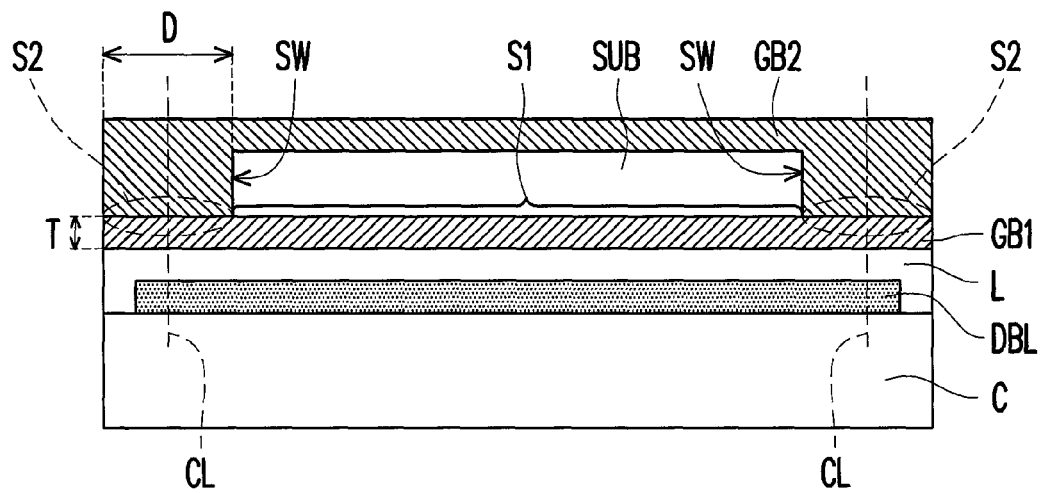
Figure 3E:
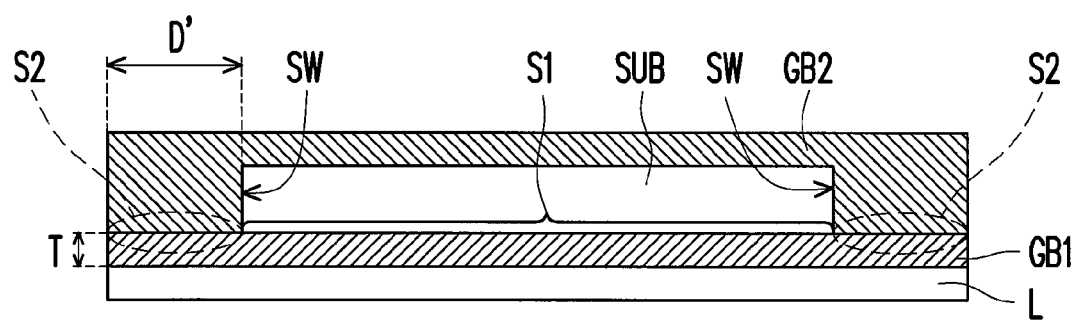

Please refer to FIGS. 3D and 3E. After completing the fabrication of the second gas barrier layer GB2, a gas barrier substrate 300 is almost complete. According to the present embodiment, in order to detach the gas barrier substrate from the carrier C, the de-bonding layer DBL, the lift-off layer L, the first gas barrier layer GB1, and the second gas barrier layer GB2 may be cut along cutting lines CL (as shown by the dashed lines CL in FIG. 3D) so that the lift-off layer L is separated from the de-bonding layer DBL. According to the present embodiment, the aforementioned cutting process is, for example, a laser cutting process or another suitable cutting process.

Still referring to FIG. 3E, after the lift-off layer L is separated from the de-bonding layer DBL, the single gas barrier substrate 300 is obtained. The gas barrier substrate 300 includes the first gas barrier layer GB1, the substrate SUB, and the second gas barrier layer GB2. The first gas barrier layer GB1 has the central bonding surface S1 and the peripheral bonding surface S2 which surrounds the central bonding surface S1. The substrate SUB is bonded with the central bonding surface S1 of the first gas barrier layer GB1, and the second gas barrier layer GB2 entirely covers the substrate SUB and the first gas barrier layer GB1. The second gas barrier layer GB2 is bonded with the substrate SUB and the peripheral bonding surface S2 of the first gas barrier layer GB1. After the de-bonding layer DBL, the lift-off layer L, the first gas barrier layer GB1, and the second gas barrier layer GB2 are cut along the cutting lines CL (as shown by the dashed lines CL in FIG. 3D), a minimum distance D' from the edge (which is the sidewall SW) of the substrate SUB to the edge of the first gas barrier layer GB1 is greater than the thickness T of the first gas barrier layer GB1.

According to the present embodiment, the first gas barrier layer GB1 and the second gas barrier layer GB2 are each, for example, a flexible gas barrier layer, and the substrate SUB is, for example, a flexible substrate. In addition, as shown in FIG. 3E, the edge of the first gas barrier layer GB1 is substantially aligned with the edge of the second gas barrier layer GB2.

FIGS. 3D' to 3E' are schematic cross-sectional diagrams showing another process of fabricating a gas barrier substrate. Please refer to FIGS. 3D, 3E, 3D', and 3E'. In FIGS. 3D and 3E, the second gas barrier layer GB2 which covers the first gas barrier layer GB1 and the substrate SUB is a conformal thin film, whereas in FIGS. 3D' and 3E', the second gas barrier layer GB2 which covers the first gas barrier layer GB1 and the substrate SUB is a thin film which has a flat top surface.

Second Embodiment

FIGS. 4A to 4E are schematic cross-sectional diagrams showing a process of fabricating a gas barrier substrate according to the second embodiment of the disclosure. Please refer to FIGS. 4A to 4E. According to the present embodiment, a fabricating method of a gas barrier substrate 400 is similar to that in the first embodiment. The main difference in between is that a substrate SUB' according to the present embodiment has a tapered sidewall SW', and an acute angle θ is included between the tapered sidewall SW' and the central bonding surface S1.

It should be noted that according to the present embodiment, the substrate SUB' is formed, for example, by coating. In detail, according to the present embodiment, a material layer may first be coated on the central bonding surface S1. The material layer is then cured to form the substrate SUB'. Since the substrate SUB' is formed by coating, the acute angle θ is included between the sidewall SW' of the substrate SUB' and the central bonding surface S1.

Figure 4A:
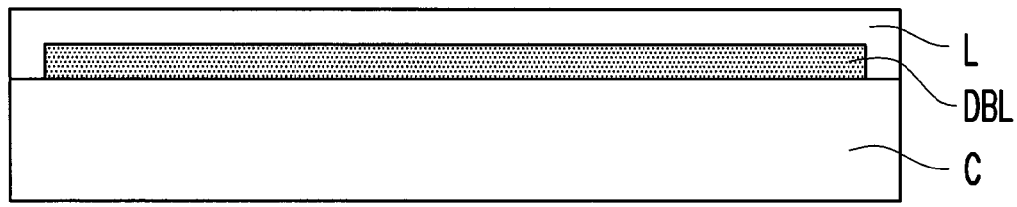
FIGS. 4A to 4E are schematic cross-sectional diagrams showing a process of fabricating a gas barrier substrate according to the second embodiment of the disclosure.
Figure 4B:
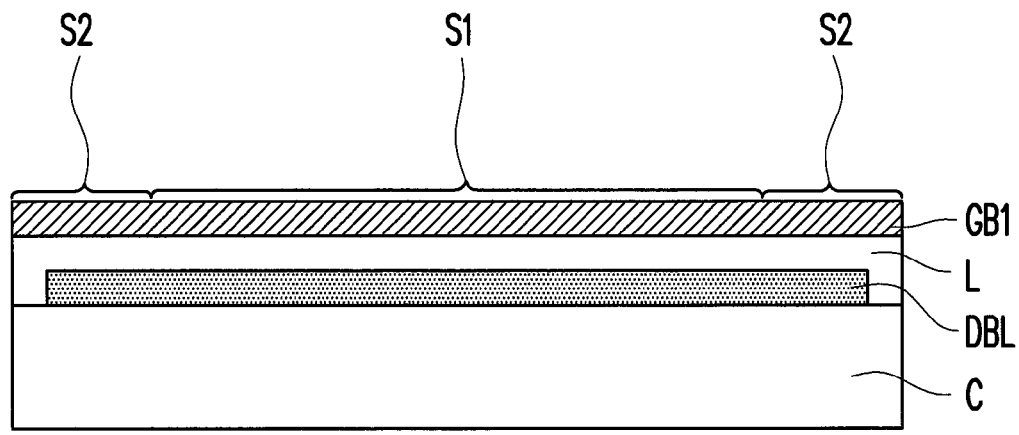
Figure 4C:
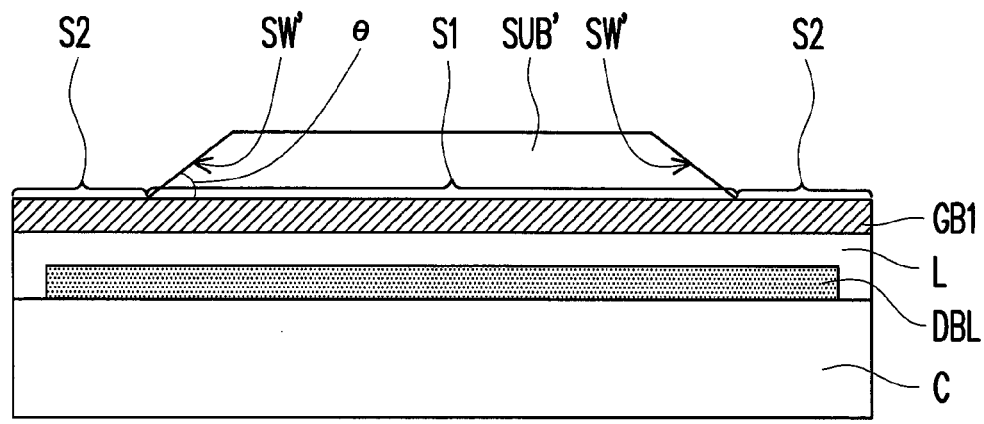
Figure 4D:
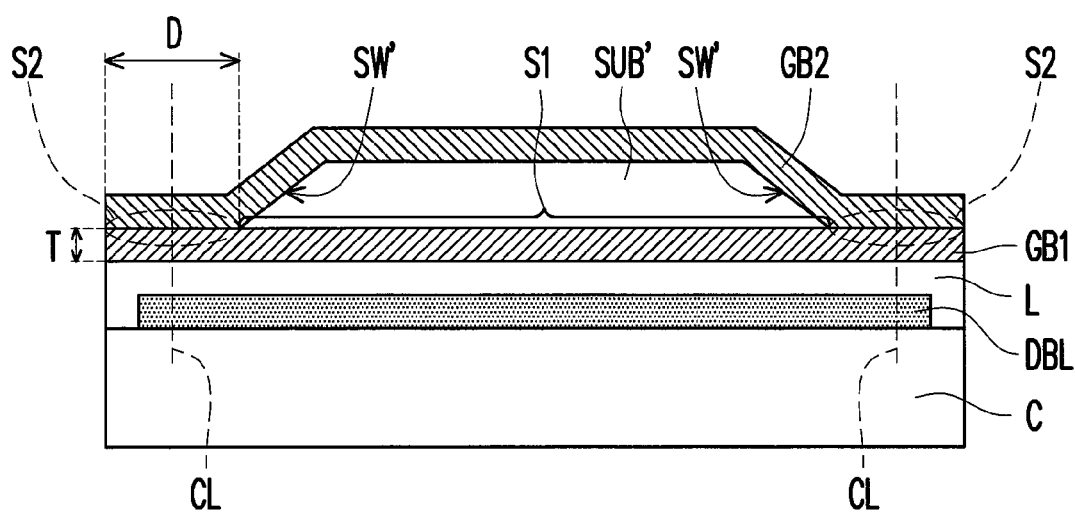
Figure 4E:
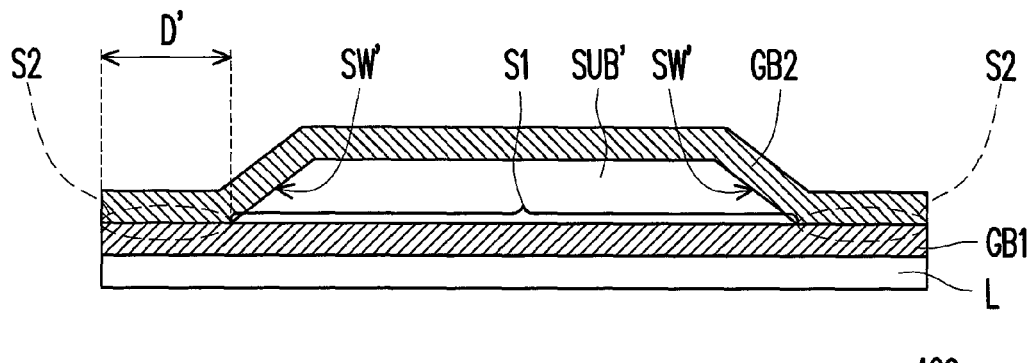
Figure 4D:
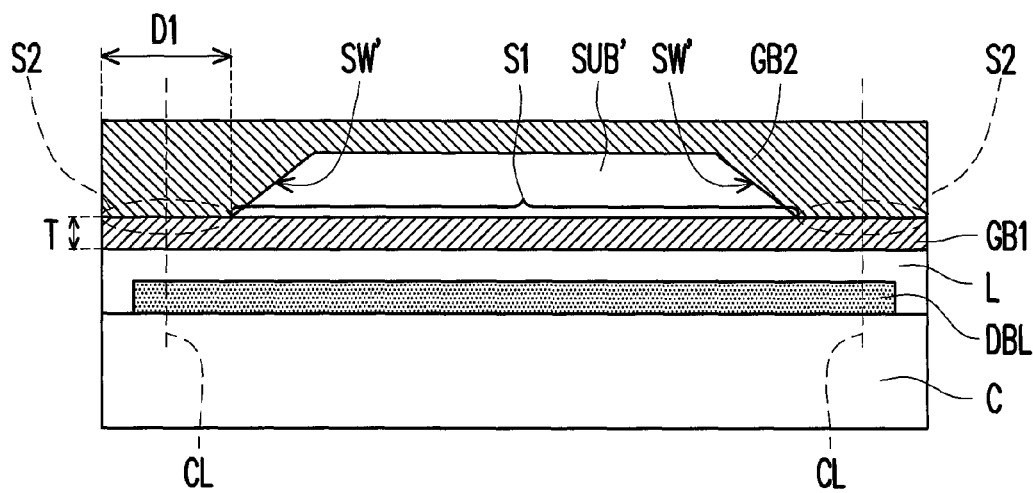
Figure 4E:
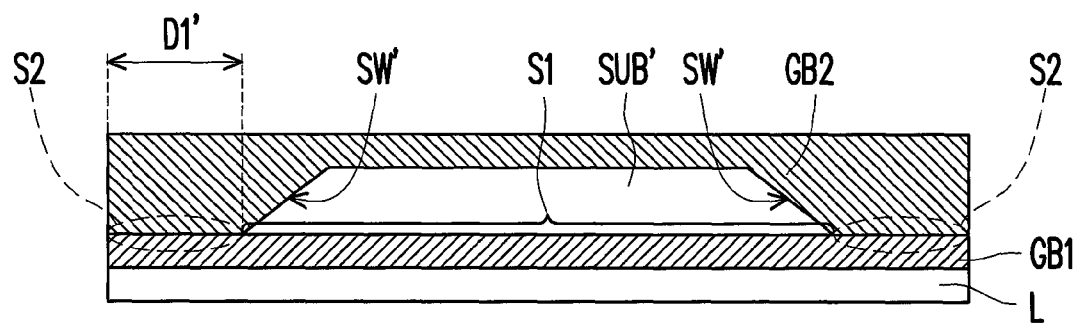

FIGS. 4D' to 4E' are schematic cross-sectional diagrams showing another process of fabricating a gas barrier substrate. Please refer to FIGS. 4D, 4E, 4D', and 4E'. In FIGS. 4D and 4E, the second gas barrier layer GB2 which covers the first gas barrier layer GB1 and the substrate SUB' is a conformal thin film, whereas in FIGS. 4D' and 4E', the second gas barrier layer GB2 which covers the first gas barrier layer GB1 and the substrate SUB' is a thin film which has a flat top surface.

Specifically, before the de-bonding layer DBL, the lift-off layer L, the first gas barrier layer GB1, and the second gas barrier layer GB2 are cut along the cutting lines CL (as shown by the dashed lines), a minimum distance D (shown in FIG. 4D) from an edge of the substrate SUB' to an edge of the first gas barrier layer GB1 is greater than a thickness T of the first gas barrier layer GB1. In addition, after the de-bonding layer DBL, the lift-off layer L, the first gas barrier layer GB1, and the second gas barrier layer GB2 are cut along the cutting lines CL, a minimum distance D' (shown in FIG. 4E) from an edge of the substrate SUB' to an edge of the first gas barrier layer GB1 is greater than a thickness T of the first gas barrier layer GB1.

Third Embodiment

FIGS. 5A to 5E are schematic cross-sectional diagrams showing a process of packaging an organic electro-luminescent device according to the third embodiment of the disclosure. Please refer to FIG. 5A. First, a de-bonding layer DBL is formed on a carrier C, and a lift-off layer L is formed on the de-bonding layer DBL and the carrier C. According to the present embodiment, the material of the de-bonding layer DBL is, for example, a parylene material, and the material of the lift-off layer L is, for example, polyimide or another material which is capable of being lift off from the de-bonding layer DBL. In an embodiment, the lift-off layer L may comprise a single thin film or a plurality of stacked thin films capable of being lifted-off from the de-bonding layer DBL. In another embodiment, the lift-off layer L may be a substrate capable of being lifted-off from the de-bonding layer DBL. For instance, the thickness of the lift-off layer L ranges from 5 micrometers to 30 micrometers. According to another embodiment of the disclosure, the de-bonding layer DBL may be formed by performing a surface treatment on the surface of the carrier C. According to the present embodiment, the lift-off layer L may also be peeled off from the carrier C along with the de-bonding layer DBL.

Figure 5A:
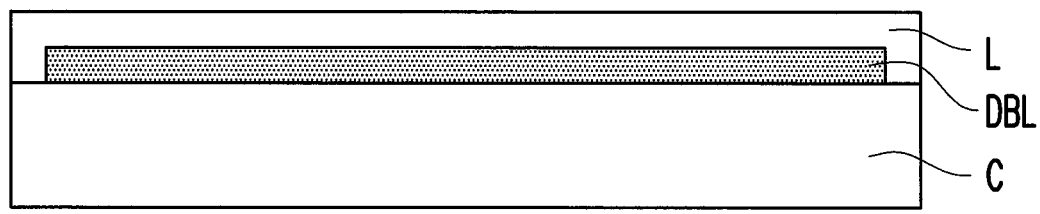
FIGS. 5A to 5E are schematic cross-sectional diagrams showing a process of packaging an organic electro-luminescent device according to the third embodiment of the disclosure.
Figure 5B:
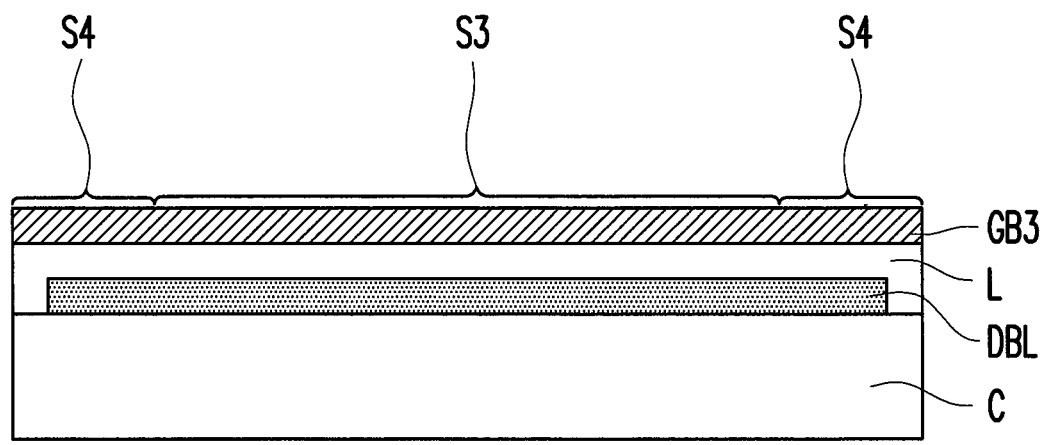

Please refer to FIG. 5B. A third gas barrier layer GB3 is formed on the lift-off layer L. The third gas barrier layer GB3 has a second central bonding surface S3 and a second peripheral bonding surface S4 surrounding the second central bonding surface S4. According to the present embodiment, the third gas barrier layer GB3 is, for example, a single layer thin film (such as a single layer silicon nitride layer) or a stacked layer formed by multiple thin films. For example, the third gas barrier layer GB3 is, for example, formed by alternately stacking at least one silicon nitride layer and at least one SOG layer. According to other embodiments, the third gas barrier layer GB3 is formed by one or more pairs of a silicon nitride layer and an SOG layer. However, it should be noted that according to the disclosure, the number and material of the third gas barrier layer GB3 are not limited to the above configuration.

Figure 5C:
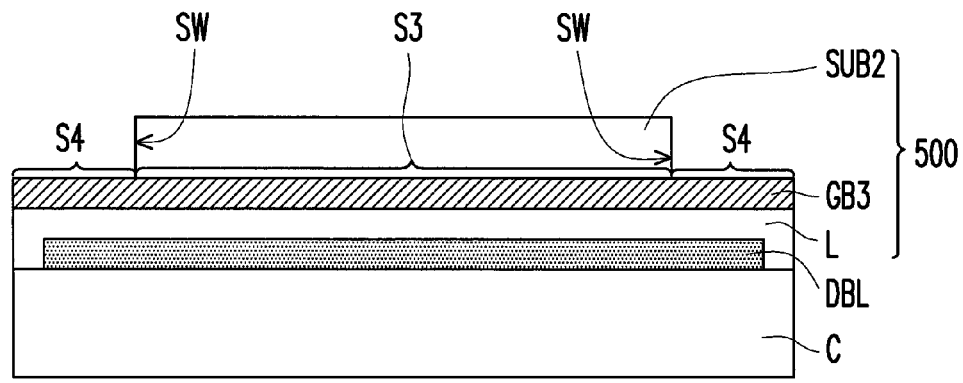

Please refer to FIG. 5C, the second substrate SUB2 is provided, and the second substrate SUB2 is bonded with the second central bonding surface S3. According to the present embodiment, the material of the second substrate SUB2 is, for example, polyimide or another flexible material. As shown in FIG. 5C, the lift-off layer L, the third gas barrier layer GB3, and the second substrate SUB2 form a gas barrier substrate 500.

Figure 5D:
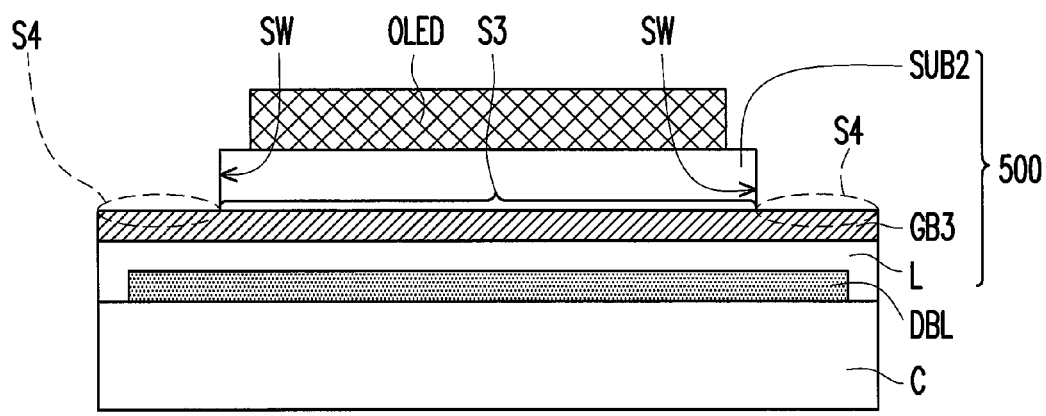

Please refer to FIG. 5D. After the second substrate SUB2 is formed, an organic electro-luminescent device OLED is formed on the second substrate SUB2. According to the present embodiment, the organic electro-luminescent device OLED is, for example, an active organic electro-luminescent device or a passive organic electro-luminescent device. The organic electro-luminescent device OLED may be a display or a light source.

Figure 5E:
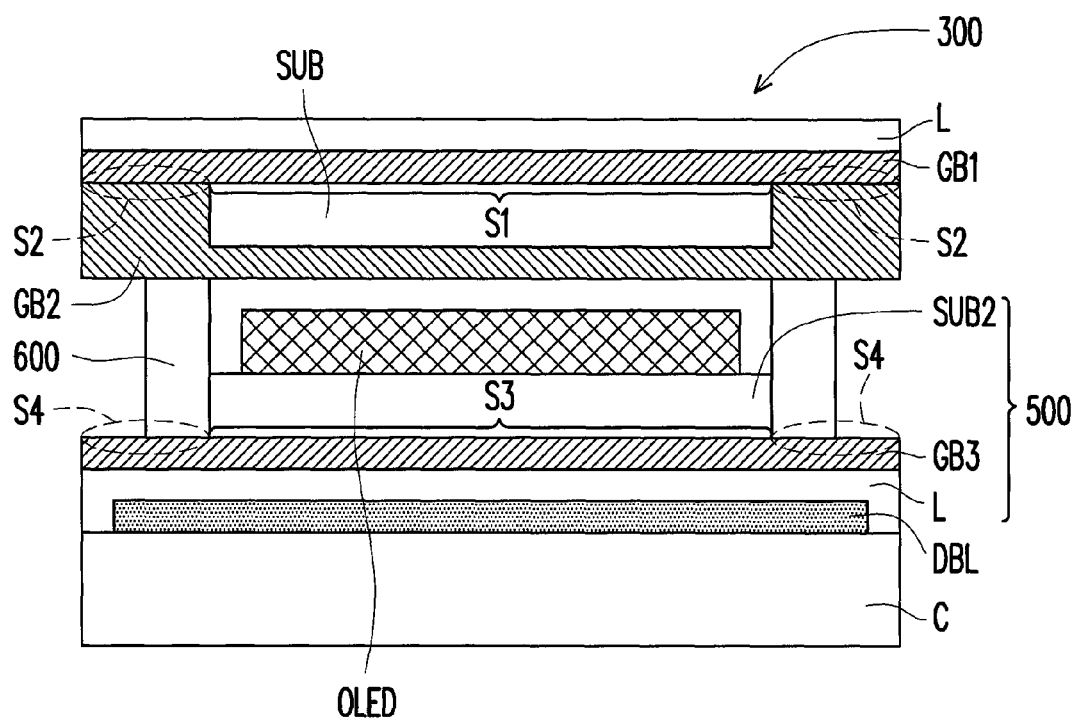

Please then refer to FIG. 5E. After the organic electro-luminescent device OLED is fabricated, the gas barrier substrate 300 is provided, and the gas barrier substrate 300 is bonded with the gas barrier substrate 500, so that the organic electro-luminescent device OLED is sealed between the gas barrier substrate 300 and the gas barrier substrate 500. In detail, the gas barrier substrate 300 and the gas barrier substrate 500 are bonded with each other by, for example, a frame adhesive 600. According to other embodiments, a frit such as a glass frit may be used to replace the frame adhesive 600, so that the gas barrier substrate 300 and the gas barrier substrate 500 are bonded with each other.

According to the present embodiment, the gas barrier substrate 300 shown in FIG. 3F is used. However, the present embodiment does not limit the gas barrier substrate to be the one shown in FIG. 3E'. The gas barrier substrate 300 or 400 shown in FIG. 3E, 4E, or 4E' may also be used in the present embodiment.

After the gas barrier substrate 300 and the gas barrier substrate 500 are bonded with each other, in order to detach the gas barrier substrate 500 from the carrier C, the de-bonding layer DBL, the lift-off layer L, and the third gas barrier layer GB3 may be cut along the cutting lines CL (as shown by the dashed lines CL in FIG. 3D') so that the lift-off layer L is separated from the de-bonding layer DBL. According to the present embodiment, the aforementioned cutting process is, for example, a laser cutting process or another suitable cutting process.

As shown in FIG. 5E, the package of the organic electro-luminescent according to the present embodiment includes the gas barrier substrate 300, the gas barrier substrate 500, and the organic electro-luminescent device OLED. The gas barrier substrate 300 is shown in FIG. 3E' and is bonded with the gas barrier substrate 500, and the organic electro-luminescent device OLED is disposed between the gas barrier substrate 300 and the gas barrier substrate 500.

Fourth Embodiment

FIGS. 6A to 6E are schematic cross-sectional diagrams showing a process of packaging an organic electro-luminescent device according to the fourth embodiment of the disclosure. Please refer to FIG. 6A. First, the de-bonding layer DBL is formed on the carrier C, and the lift-off layer L is formed on the de-bonding layer DBL and the carrier C. According to the present embodiment, the material of the de-bonding layer DBL is, for example, a parylene material, and the material of the lift-off layer L is, for example, polyimide or another material which is capable of being lift off from the de-bonding layer DBL. In an embodiment, the lift-off layer L may comprise a single thin film or a plurality of stacked thin films capable of being lifted-off from the de-bonding layer DBL. In another embodiment, the lift-off layer L may be a substrate capable of being lifted-off from the de-bonding layer DBL. For instance, the thickness of the lift-off layer L ranges from 5 micrometers to 30 micrometers. According to another embodiment of the disclosure, the de-bonding layer DBL may be formed by performing a surface treatment on the surface of the carrier C. According to the present embodiment, the lift-off layer may also be peeled off from the carrier C along with the de-bonding layer DBL.

Figure 6A:
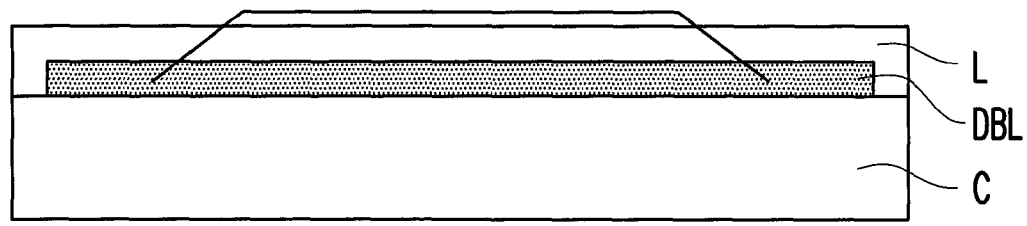
FIGS. 6A to 6E are schematic cross-sectional diagrams showing a process of packaging an organic electro-luminescent device according to the fourth embodiment of the disclosure.
Figure 6B:
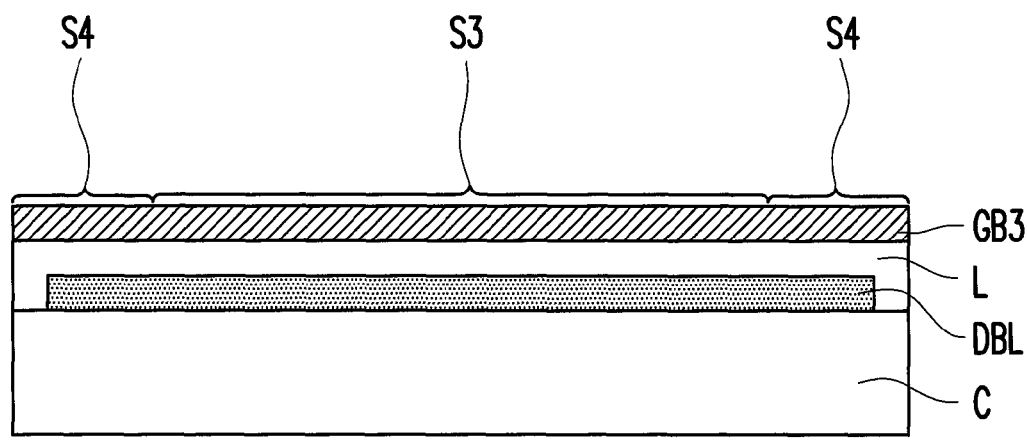

Please refer to FIG. 6B. The third gas barrier layer GB3 is formed on the lift-off layer L. The third gas barrier layer GB3 has the second central bonding surface S3 and the second peripheral bonding surface S4 surrounding the second central bonding surface S4. According to the present embodiment, the third gas barrier layer GB3 is, for example, a single thin film (such as a single silicon nitride layer) or a stacked layer formed by a plurality of thin films. For example, the third gas barrier layer GB3 is, for example, formed by alternately stacking at least one silicon nitride layer and at least one SOG layer. According to other embodiments, the third gas barrier layer GB3 is formed by one or more pairs of a silicon nitride layer and an SOG layer. However, it should be noted that according to the disclosure, the number and material of the third gas barrier layer GB3 are not limited to the above configuration.

Figure 6C:
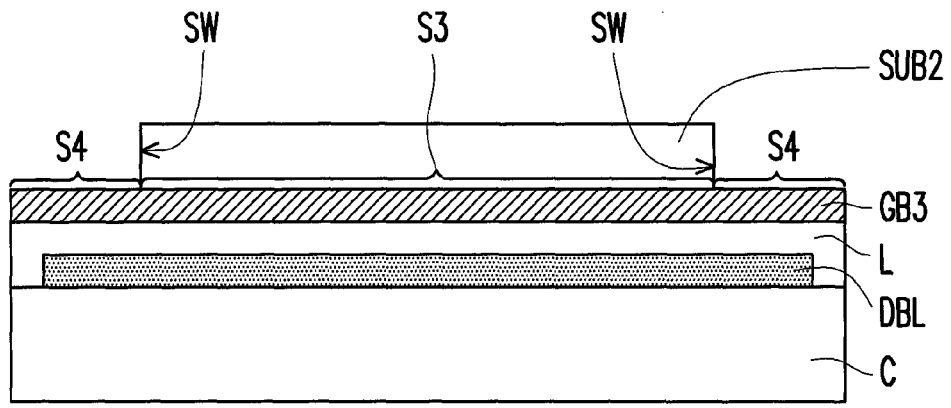

Please refer to FIG. 6C, the second substrate SUB2 is provided, and the second substrate SUB2 is bonded with the second central bonding surface S3. According to the present embodiment, the material of the second substrate SUB2 is, for example, polyimide or another flexible material. As shown in FIG. 6C, the lift-off layer L, the third gas barrier layer GB3, and the second substrate SUB2 form a gas barrier substrate 500'.

Figure 6D:
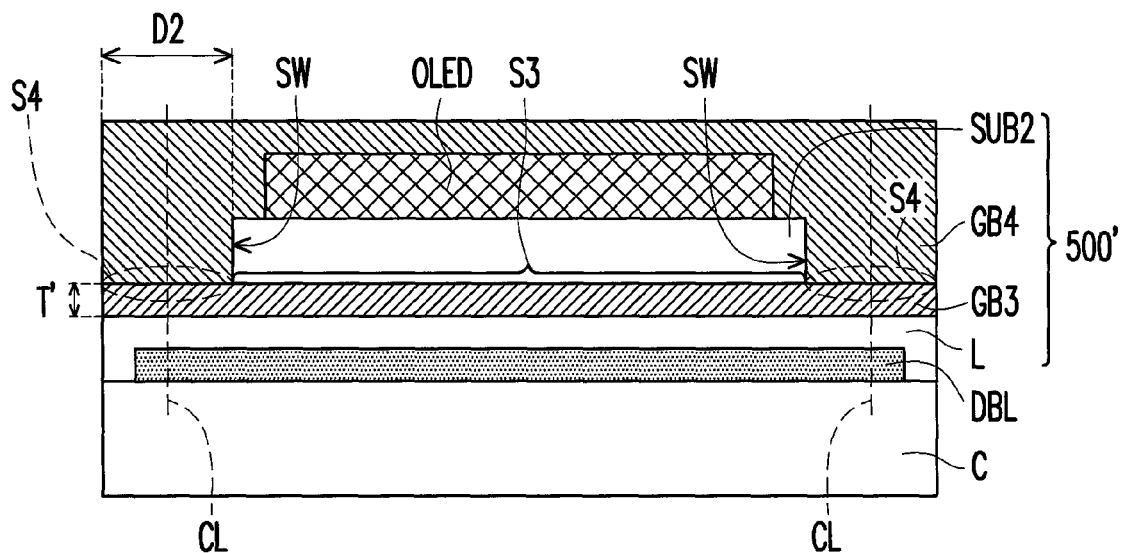

Please refer to FIG. 6D. After the second substrate SUB2 is formed, the organic electro-luminescent device OLED is formed on the second substrate SUB2. According to the present embodiment, the organic electro-luminescent device OLED is, for example, an active organic electro-luminescent device or a passive organic electro-luminescent device. The organic electro-luminescent device OLED may be a display or a light source.

After fabrication of the organic electro-luminescent device OLED is complete, a fourth gas barrier layer GB4 is formed to entirely cover the organic electro-luminescent device OLED, the second substrate SUB2, and the third gas barrier layer GB3. The fourth gas barrier layer GB4 is bonded with the organic electro-luminescent device OLED, the second substrate SUB2, and the second peripheral bonding surface S4 of the third gas barrier layer GB3, and a minimum distance D2 from an edge of the second substrate SUB2 to an edge of the third gas barrier layer GB3 is greater than a thickness T' of the third gas barrier layer GB3. In addition, the fourth gas barrier layer GB4 which covers the third gas barrier layer GB3 and the second substrate SUB2 is, for example, a conformal thin film. According to other embodiments, the fourth gas barrier layer GB4 may be a conformal thin film. As shown in FIG. 6D, the lift-off layer L, the third gas barrier layer GB3, the second substrate SUB2, and the fourth gas barrier layer GB4 form the gas barrier substrate 500'.

According to the present embodiment, the fourth gas barrier layer GB4 is, for example, a single thin film (such as a single silicon nitride layer) or a stacked layer formed by a plurality of thin films. The fourth gas barrier layer GB4 is, for example, formed by alternately stacking at least one silicon nitride layer and at least one SOG layer. According to other embodiments, the fourth gas barrier layer GB4 is formed by one or more pairs of a silicon nitride layer and an SOG layer. However, it should be noted that according to the disclosure, the number and material of the fourth gas barrier layer GB4 are not limited to the above configuration.

As shown in FIG. 6D, since the minimum distance D2 is greater than the thickness T' of the third gas barrier layer GB3, the bonding strength between the third gas barrier layer GB3 and the fourth gas barrier layer GB4 is effectively improved. In addition, if the third gas barrier layer GB3 and the fourth gas barrier layer GB4 have similar materials or the same material, the bonding between the third gas barrier layer GB3 and the fourth gas barrier layer GB4 is a type of homogeneous bonding, which thus provides good bonding strength.

Figure 6E:
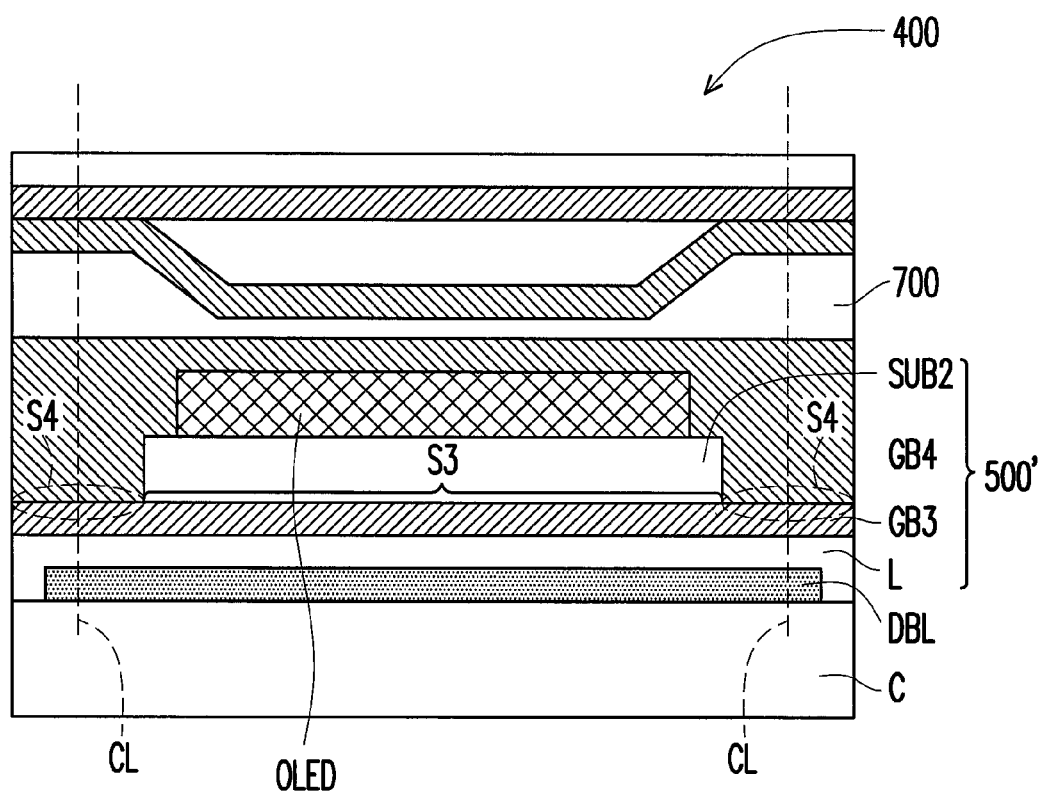

Please then to FIG. 6E. After the organic electro-luminescent device OLED and the fourth gas barrier layer GB4 are fabricated, the gas barrier substrate 400 as shown in FIG. 4E is provided, and the gas barrier substrate 400 is bonded with the gas barrier substrate 500', so that the organic electro-luminescent device OLED is sealed between the gas barrier substrate 400 and the gas barrier substrate 500'. In detail, the gas barrier substrate 400 and the gas barrier substrate 500' are bonded with each other by, for example, an adhesive layer 700. In other words, the second has barrier layer GB2 and the fourth gas barrier layer GB4 are bonded with each other through the adhesive layer 700.

According to the present embodiment, the gas barrier substrate 400 shown in FIG. 4E is used. However, the present embodiment does not limit the gas barrier substrate to be the one shown in FIG. 4E. The gas barrier substrate 300 or 400 shown in FIG. 3E, 3E', or 4E' may also be used in the present embodiment.

After the gas barrier substrate 400 and the gas barrier substrate 500' are bonded with each other, in order to detach the gas barrier substrate 500' from the carrier C, the de-bonding layer DBL, the lift-off layer L, the third gas barrier layer GB3, and the fourth gas barrier layer GB4 may be cut (as shown by the dashed lines) so that the lift-off layer L is separated from the de-bonding layer DBL. According to the present embodiment, the aforementioned cutting process is, for example, a laser cutting process or another suitable cutting process.

Fifth Embodiment

FIGS. 7A to 7E are schematic cross-sectional diagrams showing a process of packaging an organic electro-luminescent device according to the fifth embodiment of the disclosure. Please refer to FIG. 7A. First, the de-bonding layer DBL is formed on the carrier C, and the lift-off layer L is formed on the de-bonding layer DBL and the carrier C. According to the present embodiment, the material of the de-bonding layer DBL is, for example, a parylene material, and the material of the lift-off layer L is, for example, polyimide or another material which is capable of being lift off from the de-bonding layer DBL. In an embodiment, the lift-off layer L may comprise a single thin film or a plurality of stacked thin films capable of being lifted-off from the de-bonding layer DBL. In another embodiment, the lift-off layer L may be a substrate capable of being lifted-off from the de-bonding layer DBL. For instance, the thickness of the lift-off layer L ranges from 10 micrometers to 30 micrometers. According to another embodiment of the disclosure, the de-bonding layer DBL may be formed by performing a surface treatment on the surface of the carrier C. According to the present embodiment, the lift-off layer L may also be peeled off from the carrier C along with the de-bonding layer DBL.

Figure 7A:
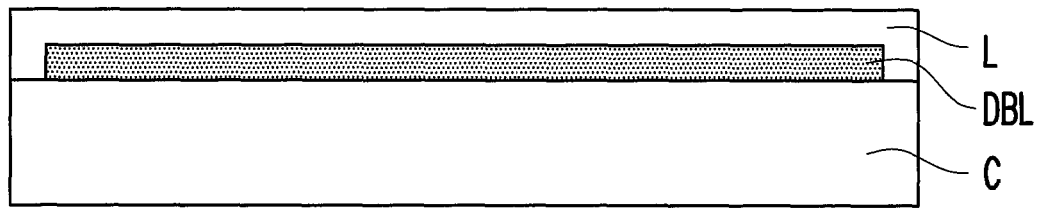
FIGS. 7A to 7E are schematic cross-sectional diagrams showing a process of packaging an organic electro-luminescent device according to the fifth embodiment of the disclosure.
Figure 7B:
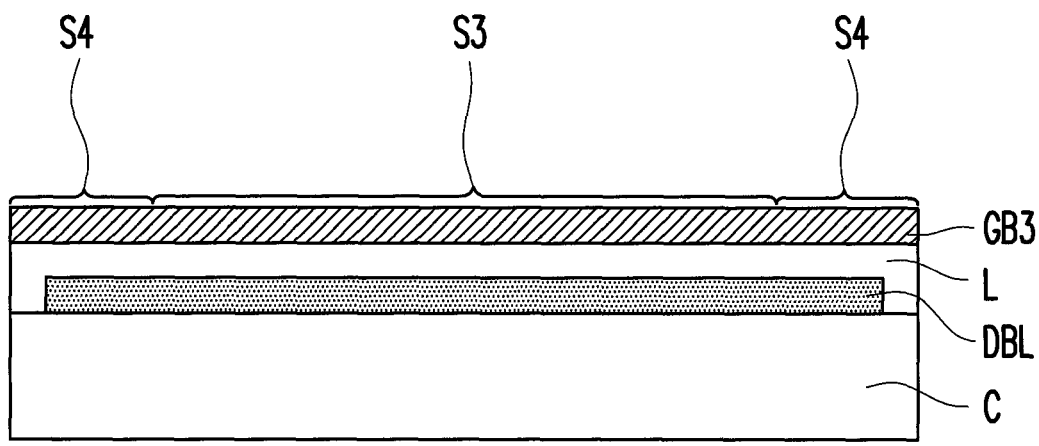

Please refer to FIG. 7B. The third gas barrier layer GB3 is formed on the lift-off layer L. The third gas barrier layer GB3 has the second central bonding surface S3 and the second peripheral bonding surface S4 surrounding the second central bonding surface S4. According to the present embodiment, the third gas barrier layer GB3 is, for example, a single thin film (such as a single silicon nitride layer) or a stacked layer formed by a plurality of thin films. For example, the third gas barrier layer GB3 is, for example, formed by alternately stacking at least one silicon nitride layer and at least one SOG layer. According to other embodiments, the third gas barrier layer GB3 is formed by one or more pairs of a silicon nitride layer and an SOG layer. However, it should be noted that according to the disclosure, the number and material of the third gas barrier layer GB3 are not limited to the above configuration.

Figure 7C:
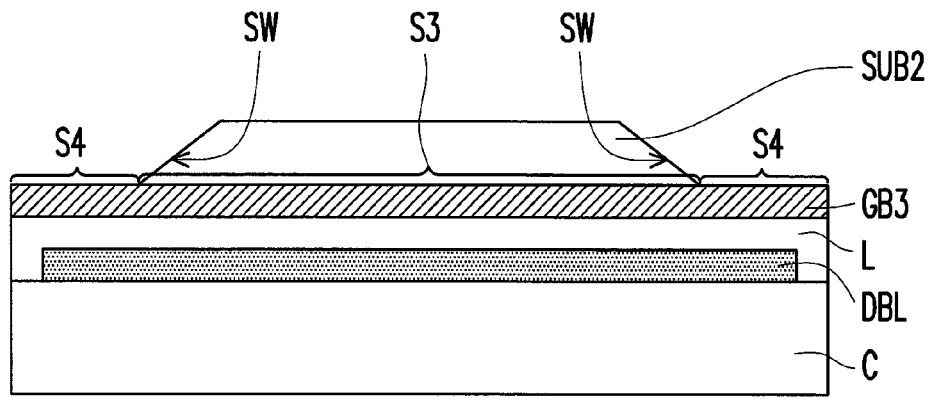

Please refer to FIG. 7C, the second substrate SUB2 is provided, and the second substrate SUB2 is bonded with the second central bonding surface S3. According to the present embodiment, the material of the second substrate SUB2 is, for example, polyimide or another flexible material.

Figure 7D:
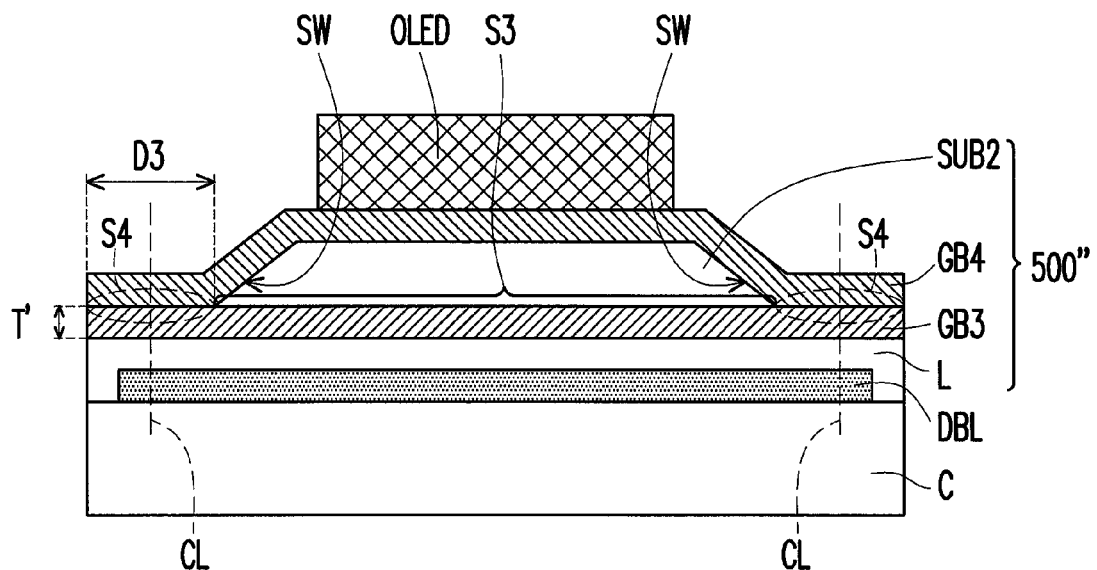

Please then refer to FIG. 7D. After the second substrate SUB2 is formed, the fourth gas barrier layer GB4 is formed to entirely cover the second substrate SUB2 and the third gas barrier layer GB3, wherein the fourth gas barrier layer GB4 is bonded with the second substrate SUB2 and the peripheral bonding surface S4 of the third gas barrier layer GB3, and the minimum distance D3 from the edge of the second substrate SUB2 to the edge of the third gas barrier layer GB3 is greater than the thickness of the third gas barrier layer GB3. As shown in FIG. 7D, the lift-off layer L, the third gas barrier layer GB3, the second substrate SUB2, and the fourth gas barrier layer GB4 form a gas barrier substrate 500".

Please refer to FIG. 7D. After the fourth gas barrier layer GB4 is formed, the organic electro-luminescent device OLED is formed on the fourth gas barrier layer GB4. According to the present embodiment, the organic electro-luminescent device OLED is, for example, an active organic electro-luminescent device or a passive organic electro-luminescent device. The organic electro-luminescent device OLED may be a display or a light source.

Figure 7E:
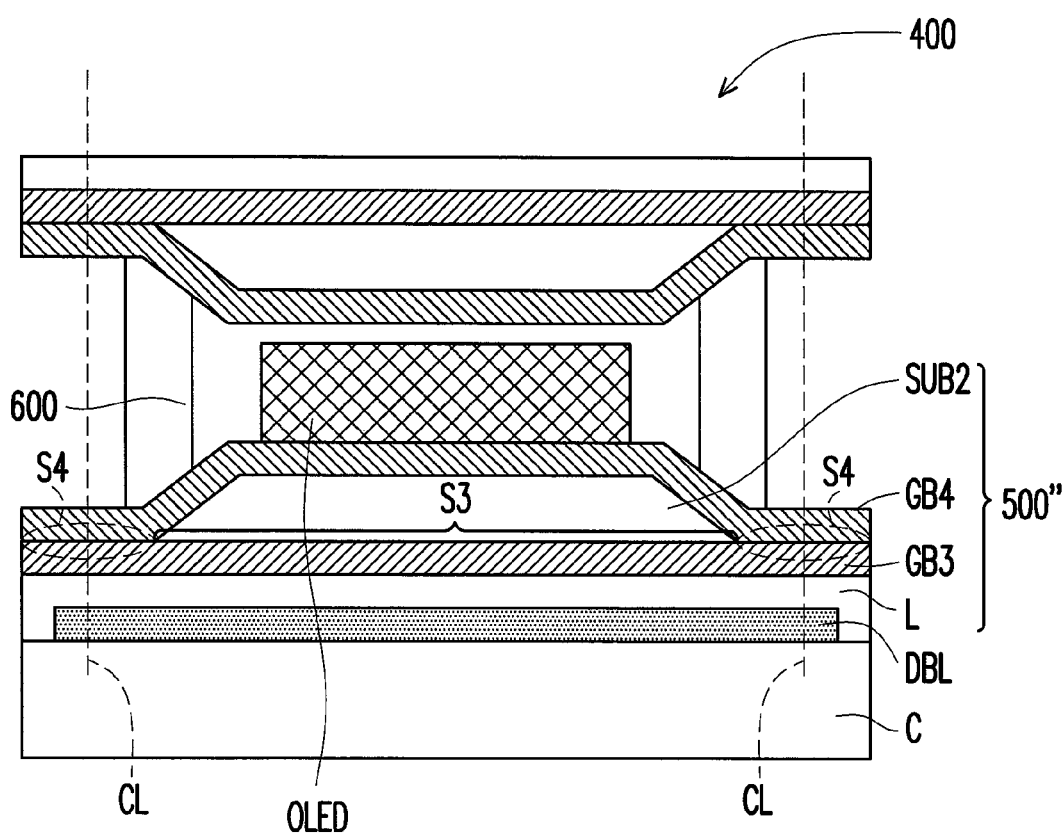

Please then to FIG. 7E. After the organic electro-luminescent device OLED is fabricated, the gas barrier substrate 400 as shown in FIG. 4E is provided, and the gas barrier substrate 400 is bonded with the gas barrier substrate 500", so that the organic electro-luminescent device OLED is sealed between the gas barrier substrate 400 and the gas barrier substrate 500". In detail, the gas barrier substrate 400 and the gas barrier substrate 500" are bonded with each other by, for example, the frame adhesive 600. According to other embodiments, a frit such as a glass frit may be used to replace the frame adhesive 600, so that the gas barrier substrate 400 and the gas barrier substrate 500" are bonded with each other.

According to the present embodiment, the gas barrier substrate 400 shown in FIG. 4E is used. However, the present embodiment does not limit the gas barrier substrate to be the one shown in FIG. 4E. The gas barrier substrate 300 or 400 shown in FIG. 3E, 3E', or 4E' may also be used in the present embodiment.

After the gas barrier substrate 400 and the gas barrier substrate 500" are bonded with each other, in order to detach the gas barrier substrate 500" from the carrier C, the de-bonding layer DBL, the lift-off layer L, the third gas barrier layer GB3, and the fourth gas barrier layer GB4 may be cut (as shown by the dashed lines) so that the lift-off layer L is separated from the de-bonding layer DBL. According to the present embodiment, the aforementioned cutting process is, for example, a laser cutting process or another suitable cutting process.

According to the disclosure, since the gas barrier substrates which have good gas barrier abilities are used for packaging the organic electro-luminescent device, the reliability of the organic electro-luminescent device is ensured.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A gas barrier substrate disposed on a carrier, the gas barrier substrate comprising:
   a de-bonding layer disposed on the carrier, a portion area of the carrier being exposed by the de-bonding layer;
   a lift-off layer covering the de-bonding layer and the portion area of the carrier exposed by the de-bonding layer;
   a first gas barrier layer covering the lift-off layer, the first gas barrier layer having a central bonding surface and a peripheral bonding surface which surrounds the central bonding surface, an area of the central bonding surface is smaller than an area of the de-bonding layer;
   a substrate bonded with the central bonding surface of the first gas barrier layer, wherein the substrate has a tapered sidewall, and an acute angle is included between the tapered sidewall and the central bonding surface; and
   a second gas barrier layer covering the substrate and the first gas barrier layer, wherein the second gas barrier layer is bonded with the substrate and the peripheral bonding surface of the first gas barrier layer, and a minimum distance from an edge of the substrate to an edge of the first gas barrier layer is greater than a thickness of the first gas barrier layer.

2. The gas barrier substrate as claimed in claim 1, wherein the first gas barrier layer and the second gas barrier layer are each a flexible gas barrier layer, and the substrate is a flexible substrate.

3. The gas barrier substrate as claimed in claim 1, wherein the edge of the first gas barrier layer is substantially aligned with the edge of the second gas barrier layer.

4. The gas barrier substrate as claimed in claim 1, wherein the first gas barrier layer comprises a silicon nitride layer.

5. The gas barrier substrate as claimed in claim 1, wherein the first gas barrier layer comprises a stacked layer, and the stacked layer comprises at least one silicon nitride layer and at least one spin-on glass (SOG) layer.

6. The gas barrier substrate as claimed in claim 1, wherein the second gas barrier layer comprises a silicon nitride layer.

7. The gas barrier substrate as claimed in claim 1, wherein the second gas barrier layer comprises a stacked layer, and the stacked layer comprises at least one silicon nitride layer and at least one spin-on glass (SOG) layer.

8. The gas barrier layer as claimed in claim 1, wherein the first gas barrier layer is disposed between the lift-off layer and the substrate.

9. A gas barrier substrate, comprising:
   a first gas barrier layer having a central bonding surface and a peripheral bonding surface which surrounds the central bonding surface;
   a substrate bonded with the central bonding surface of the first gas barrier layer, wherein the substrate has a tapered sidewall, and an acute angle is included between the tapered sidewall and the central bonding surface; and
   a second gas barrier layer covering the substrate and the first gas barrier layer, the second gas barrier layer being a conformal thin film, wherein the second gas barrier layer is bonded with the substrate and the peripheral bonding surface of the first gas barrier layer, and a minimum distance from an edge of the substrate to an edge of the first gas barrier layer is greater than a thickness of the first gas barrier layer; and
   a lift-off layer disposed on the first gas barrier layer, wherein the lift-off layer and the substrate are respectively located at two sides of the first gas barrier layer, the edge of the lift-off layer is substantially aligned with the edges of the first gas barrier layer and the second gas barrier layer.

10. The gas barrier substrate as claimed in claim 9, wherein the first gas barrier layer and the second gas barrier layer are each a flexible gas barrier layer, and the substrate is a flexible substrate.

11. The gas barrier substrate as claimed in claim 9, wherein the first gas barrier layer comprises a silicon nitride layer.

12. The gas barrier substrate as claimed in claim 9, wherein the first gas barrier layer comprises a stacked layer, and the stacked layer comprises at least one silicon nitride layer and at least one spin-on glass (SOG) layer.

13. The gas barrier substrate as claimed in claim 9, wherein the second gas barrier layer comprises a silicon nitride layer.

14. The gas barrier substrate as claimed in claim 9, wherein the second gas barrier layer comprises a stacked layer, and the stacked layer comprises at least one silicon nitride layer and at least one spin-on glass (SOG) layer.

15. A package of an organic electro-luminescent device, comprising:
   a first gas barrier substrate as claimed in claim 9;
   a second gas barrier substrate bonded with the first gas barrier substrate; and
   an organic electro-luminescent device disposed between the first gas barrier substrate and the second gas barrier substrate.

16. The package of the organic electro-luminescent device as claimed in claim 15, wherein the second gas barrier substrate comprises:
   a third gas barrier layer having a second central bonding surface and a second peripheral bonding surface which surrounds the second central bonding surface;
   a second substrate bonded with the second central bonding surface of the third gas barrier layer, wherein the organic electro-luminescent device is disposed on the second substrate.

17. The package of the organic electro-luminescent device as claimed in claim 15, wherein the second gas barrier substrate comprises:
   a third gas barrier layer having a second central bonding surface and a second peripheral bonding surface which surrounds the second central bonding surface;
   a second substrate bonded with the second central bonding surface of the third gas barrier layer, wherein the organic electro-luminescent device is disposed on the second substrate; and
   a fourth gas barrier layer covering the second substrate, the organic electro-luminescent device, and the third gas barrier layer, wherein the fourth gas barrier layer is bonded with the second substrate, the organic electro-luminescent device, and the second peripheral bonding surface of the third gas barrier layer, and a minimum distance from an edge of the second substrate to an edge of the third gas barrier layer is greater than a thickness of the third gas barrier layer.

18. The package of the organic electro-luminescent device as claimed in claim 15, wherein the second gas barrier substrate comprises:
   a third gas barrier layer having a second central bonding surface and a second peripheral bonding surface which surrounds the second central bonding surface;
   a second substrate bonded with the second central bonding surface of the third gas barrier layer; and
   a fourth gas barrier layer covering the second substrate and the third gas barrier layer, wherein the fourth gas barrier layer is bonded with the second substrate and the second peripheral bonding surface of the third gas barrier layer, a minimum distance from an edge of the second substrate to an edge of the third gas barrier layer is greater than a thickness of the third gas barrier layer, and the organic electro-luminescent device is disposed on the fourth gas barrier layer.

* * * * *